United States Patent
Ikram et al.

(10) Patent No.: US 10,002,218 B2
(45) Date of Patent: Jun. 19, 2018

(54) VERIFICATION OF A MULTICHIP COHERENCE PROTOCOL

(71) Applicant: CAVIUM, INC., San Jose, CA (US)

(72) Inventors: Shahid Ikram, Shrewsbury, MA (US); Isam Akkawi, Santa Clara, CA (US); Richard Eugene Kessler, Northborough, MA (US); James Ellis, Hubbardston, MA (US); David Asher, Sutton, MA (US)

(73) Assignee: Cavium, Inc., San Jose, CA (US)

( * ) Notice: Subject to any disclaimer, the term of this patent is extended or adjusted under 35 U.S.C. 154(b) by 216 days.

(21) Appl. No.: 15/065,799

(22) Filed: Mar. 9, 2016

(65) Prior Publication Data

US 2016/0267209 A1  Sep. 15, 2016

Related U.S. Application Data

(60) Provisional application No. 62/132,420, filed on Mar. 12, 2015.

(51) Int. Cl.
*G06F 17/50* (2006.01)
*G06F 12/0817* (2016.01)

(52) U.S. Cl.
CPC ...... *G06F 17/5045* (2013.01); *G06F 12/0817* (2013.01); *G06F 2212/622* (2013.01)

(58) Field of Classification Search
CPC .................................................. G06F 17/5045
USPC ....................................................... 716/107
See application file for complete search history.

(56) References Cited

U.S. PATENT DOCUMENTS

| | | | |
|---|---|---|---|
| 6,975,976 B1 | 12/2005 | Casavant | |
| 2005/0286366 A1 | 12/2005 | Coulter, Jr. | |
| 2007/0186197 A1 | 8/2007 | Lu | |
| 2010/0199244 A1 | 8/2010 | Kwok et al. | |
| 2010/0218150 A1 | 8/2010 | Baumgartner et al. | |
| 2012/0216159 A1 | 8/2012 | Baumgartner et al. | |
| 2015/0154341 A1* | 6/2015 | Ikram | G06F 17/5081 716/111 |
| 2015/0212905 A1* | 7/2015 | Gschwind | G06F 11/1474 714/42 |

(Continued)

OTHER PUBLICATIONS

Spear, C. and Tumbush, G., System Verilog for Verification, Third Edition, Springer, ISBN 978-1-4614-0714-0, 608 pages, 2012.

(Continued)

*Primary Examiner* — Suchin Parihar

(57) ABSTRACT

A system includes a formal verification engine running on a host and a protocol checking engine. The formal verification engine automatically generates and formally verifies a reference specification that includes a plurality of extended state tables for an integrated circuit (IC) design protocol of a chip at architectural level. The formal verification engine is further configured to automatically generate a plurality of self-contained services from the plurality of extended state tables. A self-contained service of the plurality of self-contained services is randomly and atomically executable. The self-contained service of the plurality of self-contained services changes responsive to the IC design protocol changing. The protocol checking engine checks and validates completeness and correctness of the self-contained service of the reference specification.

33 Claims, 8 Drawing Sheets

(56) References Cited

U.S. PATENT DOCUMENTS

2015/0302133 A1* 10/2015 Ikram ............... G06F 17/5045
716/111
2017/0262227 A1* 9/2017 Bradbury ............ G06F 12/084

OTHER PUBLICATIONS

Tasiran, S. Yu, Yuan and Batson, Brannon, Using a Formal Specification and a Model Checker to Monitor and Direct Simulation, In Proceedings of DAC2003, Jun. 2-6, 2003, pp. 356-361.
Su, Man-Yun, etc., FSM-based Transaction-level Functional Coverage for Interface Compliance Verification, In Proceedings of Asian and South Pacific Conference on Design Automation, Jan. 24-27, 2006.
Lachish, O., etc., Hole Analysis for Functional Coverage Data, In Proceedings of DAC2002, Jun. 2-6, 2003.
Kwon, Young-Su, etc., Systematic Functional Coverage Metric Synthesis from Hierarchical Temporal Event Relation Graph, In Proceedings of DAC2004, Jun. 2-6, 2003.
Verma, Shireesh, Harris, Ian etc., Automatic Generation of Functional Coverage Models from Behavioral Verilog Descriptions, In Proceedings of Date2007, Apr. 16-20, 2007.
Weber, Ross, Modeling and Verifying Cache-Coherent Protocols, VIP, and Designs, Jasper Design Automation, Jun. 2011.
Sorin, D.J., etc., Specifying and Verifying a Broadcast and a Multicast Snooping Cache Coherence Protocol, Reasoning about naming Systems, IEEE Transactions on Parallel and Distributed Systems (TPDS) vol. 13, No. 5, Jun. 2002, pp. 556-578.
Ho, Pei, etc., Smart Simulation using Collaborative Formal and Simulation Engines, In IEEE International Conference on CAD, pp. 120-126, 2000.
Holzmann, G.J., The Spin Model Checker: Primer and Reference Manual, Addison-Wesley, ISBN 0-321-22862-6, 608 pages, 2004.
IEEE Standard for System Verilog—Unified Hardware Design, Specification and Verification Language, IEEE 1800-2012, 2012.
Vijayaraghavan, S., etc., A Practical Guide for system Verilog Assertions, Springer, ISBN 0-387-26049-8, 334 pages, 2005.
Bergeron, Janick, Writing Testbenches using System Verilog, First Edition, Springer, ISBN 978-1-4419-39784-0, 406 pages, 2006.
Sedgewick, Robert and Wayne, Kevin, Algorithm, Fourth Edition, Springer, ISBN 978-0-3215-7351-3, 992 pages, 2011.
Plakal et al., Lamport Clocks: Verifying a Directory Cache-Coherence Protocol, Proceedings of the Tenth Annual ACM Symposium of Parallel Algorithms and Architectures, Jun. 28-Jul. 2, 1998, pp. 67-76.
Eisner et al., A Methodology for Formal Design of Hardware Control with Application to Cache Coherence Protocols, Proceedings of the 37th Annual Design Automation Conference, Jun. 2000, 6 pages.
Gouda, Protocol Verification Made Simple. In Proceedings of Computer Networks and ISDN Systems 25. pp. 969-980, 1993.
Milne, A Model for Hardware Description and Verification.. In Proceedings of DAC1984, Jun. 2-6, 1984. 21st Design automation Conference. 1984.
Dill, etc., Protocol Verification as a Hardware Design Aid. In Proceedings of IEEE International Conference on Computer Design: VLSI in Computers and Processors. pp. 522-525, Oct. 1992.
Holzman, G.J., Joshi, R. and Groce, A., Swarm Verification Techniques. In Proceedings of ASE 2008, 23rd IEEE ACM Int. Conf. on Automated Software Engineering. L'Auila, Italy, Sep. 2008.
Ikram, Shahid and Akkawi, Isam, Modeling and Verifying a Coherence Protocol using JG-ARCH. In Proceedings of Jasper Architectural Formal Verification Forum 2014, Santa Clara, CA, Oct. 2013.
O'Leary, Protocol Verification Using Flows: An Industrial Experience. In the Proceedings of FMCAD 2009.
Ikram, Shahid and Akkawi, Isam, A Framework for Specifying, Modeling, Implementation and Verification of SOC Protocols. In IEEE SOCC Conference Proceedings 2014, Las Vegas, NV, Sep. 2014.

* cited by examiner

```
// The polling loop, for a given address starts:
//Starting point of the polling loop
//Choose randomly among available choices.

case(true)
(Home node has no pending request): goto LocalAddressRequest;
(Remote node has no pending request): goto RemoteAddressRequest;
(There is a request from a remote): goto HomeReceiveRequest;
(There is a response message for remote): goto RemoteReceiveResponse;

(There is a forwarding message for remote): goto RemoteReceiveForwardRequest;
(There is response message for home): goto HomeReceiveResponse;
Default: goto deadlockchecker;        //No options for this address; It is a deadlock.
endcase
goto start;
```

FIG. 2B

| Current State | | | | Next State | | | | Outputs | | | Inputs |
|---|---|---|---|---|---|---|---|---|---|---|---|
| Cmd | H | N1 | N2 | N3 | Cmd | H | N1 | N2 | N3 | N1 | N2 | N3 | Req Resp Event |

| Current State | | | | Next State | | | | Outputs | | | Inputs |
|---|---|---|---|---|---|---|---|---|---|---|---|
| Cmd | H | N1 | N2 | N3 | Cmd | H | N1 | N2 | N3 | N1 | N2 | N3 | Req Resp Event |
| none | E | I | I | I | none | S | S | I | I | RD_RSP (Read Response) | - | - | OCI_RD (Read from remote node) |
| none | S | S | I | I | LCL_WR | S | S>I | I | I | INV (Invalidate) | - | - | LCL_WR_LCL_A (local write to home address) |
| LC_WR | S | S>I | I | I | none | M | I | I | I | - | - | - | INV_RSP (invalidate response) |

FIG. 4A

| Current State | | Next State | | Outputs | | | Inputs |
|---|---|---|---|---|---|---|---|
| Cmd | St | Cmd | St | H | N2 | N3 | Req Resp Event |
| none | I | OCI_RD | I | OCI_RD (Read from remote node – i.e. home) | - | - | LCL_RD_RMT_A (local read – remote address) |
| OCI_RD | I | none | S | - | - | - | RD_RSP (read response) |
| none | S | none | I | INV_RSP (Invalidate Response) | - | - | INV (invalidate) |

FIG. 4B

VERIFICATION OF A MULTICHIP COHERENCE PROTOCOL

CROSS REFERENCE TO RELATED APPLICATIONS

This application claims the benefit and priority to the U.S. Provisional Patent Application No. 62/132,420, filed Mar. 12, 2015, and entitled "Design and Verification of a Multichip Coherence Protocol," and is hereby incorporated herein by reference.

BACKGROUND

A chip design process has a plurality of discrete phases that include but are not limited to conception, architecture design, register-transfer level (RTL) design, physical design, and tape-out. Some of the key metrics to measure success of a chip design project are timeliness, correctness, and completeness of the design. One way to enhance timeliness and to reduce time-to-market of the chip design project is to achieve the objectives of completeness and correctness as early in the design process as possible. Since RTL design verification is typically the most time-consuming phase in the chip design process. Furthermore, additional time is required if the RTL design verification process encounters an error, thereby requiring the error to be fixed and for the RTL design verification process to start all over again.

In practice, multiple chip design projects may overlap in time. Different groups in a chip design team may work on different design phases of these projects at the same time. For example, when the RTL design group is taping out one of the projects, the chip design architects may be working on another project. Similarly, when the RTL design group is in the RTL design phase of a project, the verification group may be incorporating new features into the chip verification environment. As such, there is an opportunity for parallelism and pipelining among of the chip design projects that will increase the throughput of the chip design team by automating the transfer and sharing of knowledge among the different groups in the team.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

FIG. 2B depicts an example of a generic modeling in accordance with some embodiments.

FIGS. 4A and 4B depict examples of tables for home and remote services provided by the IC design protocol, respectively.

DETAILED DESCRIPTION OF EMBODIMENTS

Figure 1:
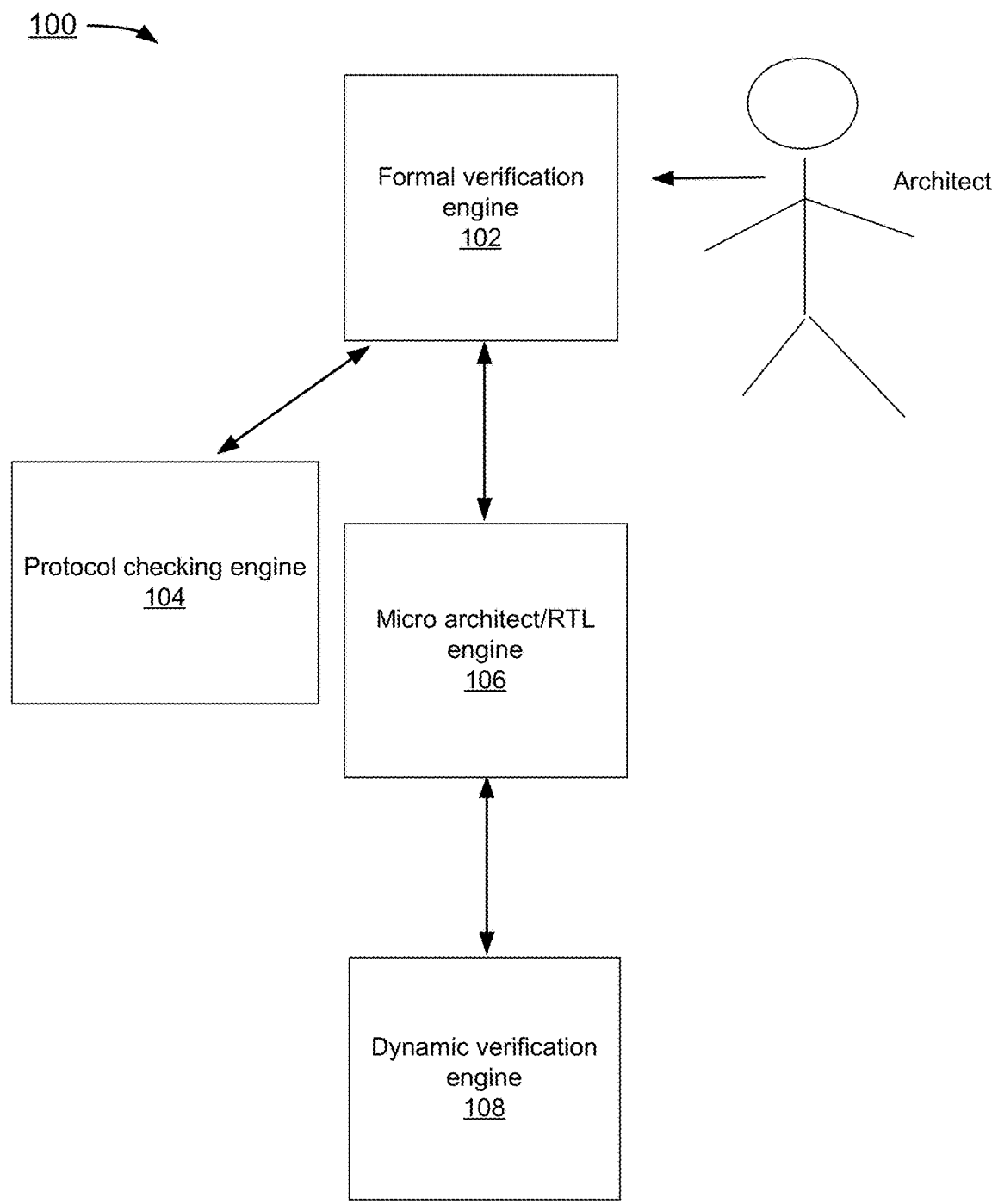
FIG. 1 shows an example of a system diagram to design, verify and implement protocols for design of an IC chip.

The approach is illustrated by way of example and not by way of limitation in the figures of the accompanying drawings in which like references indicate similar elements. It should be noted that references to "an" or "one" or "some" embodiment(s) in this disclosure are not necessarily to the same embodiment, and such references mean at least one.

A need has arisen to accelerate RTL verification and to reduce the overall project time. Moreover, a need has arisen to establish quick assurance of correctness of protocol modification without a need for a comprehensive RTL verification process. A new approach is proposed that contemplates systems and methods to support a hybrid verification framework (HVF) to design, verify, and implement design protocols for an integrated circuit (IC) chip such as a system-on-chip (SOC) and/or an application-specific integrated circuit (ASIC) chip. The framework creates a plurality of specifications in the form of extended state transition tables as well as a plurality of templates for different phases of a design flow of the IC chip. The framework integrates and uses the extended state table-based specifications in all phases in the design flow, resulting in a tight revision loop of debug, verification, and validation across the phases of the design flow. The revision loop facilitates any protocol changes to be incorporated in all phases of the design flow and to be validated at all levels within a short time period, which in turn reduces time to market of the IC chip.

In some embodiments, the extended state transition tables can be divided into unique roles/services tables also referred to throughout the application as self-contained services. The protocol may include a multichip coherence interconnect protocol (OCI). The self-contained service, e.g., OCI roles, are per-address based protocol and are therefore randomly selectable and atomically executable without the need for concurrency. In other words, the self-contained services do not interact with each other's protocol space. Protocol iterations and changes thereto cause only changes to the self-contained service. As such, protocol validation is not limited or hindered by manual translations and model changes. Use of self-contained services, as described above, allows non-deterministic selection of, for example OCI roles, at a given address.

Conventional systems assume an all-invalid initial states, therefore requiring verification of all initial states. In contrast, the embodiments only require validation of a subset of all possible states, thereby reducing the amount of time required for verification. According to some embodiments, the extended state transition tables provide a list of valid non-transient states. As such, any of the valid non-transient state can be randomly selected and executed and that the self-contained service, e.g., OCI, will always be valid for the selected state. Accordingly, the embodiments provide model verification tools for multiple initial states, any one of which can be selected, for which only a subset of all transitions are enabled. The verification process is therefore divided into smaller pieces and results in a faster coverage of the complete protocol transition set because only a small subset of all possible initial states are required to be verified. In other words, a subset of the instructions is used to create small models for quick assurance of the correctness of the protocol modifications.

In some embodiments, framework speeds up the RTL design and verification process by formally verifying correctness and completeness of the architectural entities of the protocol before a line of the RTL is written and using these formally verified pieces of information throughout the design flow. Such an approach also enables finding of as many bugs as possible in the early stages of the design flow. Moreover, all verification steps are interlocked, such that a bug occurrence and identification at a later phase of the design flow (e.g., at RTL level) can be traced back, replayed, and resolved at the earlier phase of the design flow (e.g., architectural level).

FIG. 1 shows an example of a system diagram to design, verify and implement protocols for design of an IC chip. Although the diagrams depict components as functionally separate, such depiction is merely for illustrative purposes. It will be apparent that the components portrayed in this figure can be selectively combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 1, the system 100 includes a formal verification engine 102, a protocol checking engine 104, a micro architect/RTL engine 106 and a dynamic verification (DV) engine 108. As used herein, the term engine refers to software, firmware, hardware, or other component that is used to effectuate a purpose. The engine will typically include software instructions that are stored in non-volatile memory (also referred to as secondary memory). When the software instructions are executed, at least a subset of the software instructions is loaded into memory (also referred to as primary memory) by a processor. The processor then executes the software instructions in memory. The processor may be a shared processor, a dedicated processor, or a combination of shared or dedicated processors. A typical program will include calls to hardware components (such as I/O devices), which typically requires the execution of drivers. The drivers may or may not be considered part of the engine, but the distinction is not critical.

In the example of FIG. 1, each of the engines can run on one or more hosting devices (hosts). Here, a host can be a computing device, a communication device, a storage device, or any electronic device capable of running a software component. For non-limiting examples, a computing device can be but is not limited to a laptop PC, a desktop PC, a tablet PC, or a server machine. A storage device can be but is not limited to a hard disk drive, a flash memory drive, or any portable storage device. A communication device can be but is not limited to a mobile phone.

Formal Verification

In the example of FIG. 1, formal verification engine 102 is configured to automatically generate and formally verify a reference specification/model that includes a plurality of extended state tables as part of a design protocol for an IC chip (the terms reference specification and reference model are used interchangeably in the discussions below). Since the protocol may be under constant revision during the IC design process, the formal verification engine 102 automatically incorporates and validates any incremental changes to the protocol quickly during the design flow in order to support maintainability of the protocol.

As referred to hereinafter, the IC design protocol (or protocol in short) describes details of an IC design at various levels. Specifically, the protocol describes various components in the IC design project, the relationships, connections, and interactions among these components, and the interfaces between these components and external components outside of the IC chip. The protocol includes at least the reference model used for formal verification of the protocol at the architectural level and a synthesizable package used for implementation of the protocol at the micro-architectural or RTL level as discussed below. In some embodiments, the reference specification of the protocol can be regarded as "golden" as any changes to the protocol in all phases of the IC design process, for a non-limiting example, at the RTL level, can be propagated to and maintained at the architectural level of the protocol in the reference specification. In addition to information typically included in state tables for a finite state machine (FSM), each of the extended state tables of the reference model further includes additional information related to the implementation of the IC design protocol that is shared among various phases of the IC design process as shown by the examples depicted in FIGS. 4A and 4B discussed below.

Figure 2A:
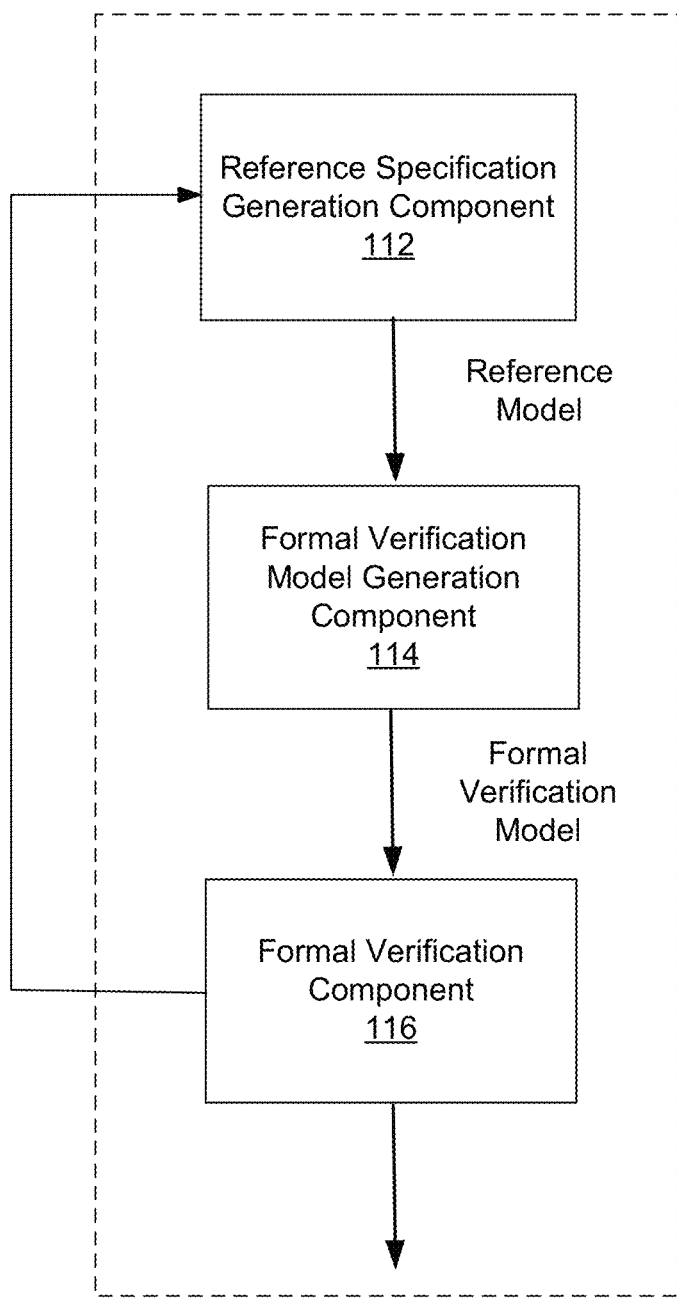
FIG. 2A depicts an example of various components within a formal verification engine.

As shown in the example depicted in FIG. 2A, formal verification engine 102 includes at least a reference specification generation component 112, a formal verification model generation component 114, and a formal verification component (formal verifier) 116. During the operation of formal verification engine 102, the reference specification generation component 112 accepts inputs from an architect of the IC design protocol and automatically generates the golden reference specification/model in ASCII formatted state tables as well as additional role/service tables as discussed in details below. In some embodiments, for OCI modeling, two transition tables for home and remote can be divided into six self-contained services or also known as role/service tables. For example, a generic model as shown in FIG. 2B may be developed.

The protocol may include a multichip coherence interconnect protocol OCI. The self-contained service, e.g., OCI roles, are per-address based protocol and are therefore randomly selectable and atomically executable without the need for concurrency. In other words, the self-contained services do not interact with each other's protocol space. Protocol iterations and changes thereto cause only changes to the self-contained service. As such, protocol validation is not limited or hindered by manual translations and model changes. Use of self-contained services allows non-deterministic selection of, for example OCI roles, at a given address. It is appreciated that the OCI model may be parameterized in terms of addresses, nodes, and channel depths.

It is appreciated that the reference specification generation component 112 manages the protocol in a programmable way and provides a uniform consistent output of the reference specification for any changes to the protocol. The formal verification model generation component 114 then creates a formal verification (FV) specification/model by merging the tables from the golden reference model with templates and instrumentations generated for verification. For example, the unique self-contained services tables for OCI may be merged from the golden reference model with templates and instrumentations generated for verification.

In some embodiments, the formal verification model generation component 114 uses the templates as wrappers around the protocol tables, e.g., self-contained services tables. It is appreciated that there is one template per protocol service/role table. The instrumentations include but are not limited to, model assumptions, reduction constraints, completeness properties, and correctness properties. The FV model is a formally verifiable set of files, generated as a composition of the roles/services tables, templates, and instrumentations. The formal verification component 116 utilizes the FV model to formally verify the golden reference specification for the IC design protocol.

In some embodiments, only validation of a subset of all possible states is required, thereby reducing the amount of time required for verification. According to some embodiments, the extended state transition tables provide a list of valid non-transient states. As such, any of the valid non-transient states can be randomly selected and executed and that the self-contained service, e.g., OCI, will always be valid for the selected state. Accordingly, the embodiments provide model verification tools for multiple initial states, any one of which can be selected, for which only a subset of all transitions are enabled. The verification process is therefore divided into smaller pieces and results in a faster coverage of the complete protocol transition set because only a small subset of all possible initial states are required to be verified. In other words, a subset of the instructions is used to create small models for quick assurance of the correctness of the protocol modifications.

In one embodiment, after a determination that the protocol modifications are correct based on the small models that have been created, as described above, the reference specification generation component 112 may then manage the protocol in a programmable way and provides a uniform consistent output of the reference specification for any changes to the protocol. The formal verification model generation component 114 then creates a formal verification (FV) specification/model by merging the tables from the golden reference model with templates and instrumentations generated for verification. In some embodiments, the formal verification model generation component 114 uses the templates as wrappers around the protocol tables and there is one template per protocol service/role table. The instrumentations include but are not limited to, model assumptions, reduction constraints, completeness properties, and correctness properties. The FV model is a formally verifiable set of files, generated as a composition of the roles/services tables, templates, and instrumentations. The formal verification component 116 utilizes the FV model to formally verify the golden reference specification for the IC design protocol.

Although table-based specifications have been around for a long time and have been used in various phases of a chip design, they are generally written for the purpose of being used with one signal objective/task in minds. In addition, these specifications usually contain a lot of hidden state information such as transitional states, which require a leap of faith between the architect, the implementer and the verifier of the chip design team.

In some embodiments, the golden reference specification/model created by reference specification generation component 112 of the formal verification engine 102 is in parsable ASCII format. The reference model includes sufficient information for the automatic generation of formal verification, RTL verification, dynamic verification, and coverage collaterals. The reference model does not have any hidden states or assumptions, redundancy, or dead-ends, and is readable and can be understood and consumed by all relevant parties at all phases in the IC design process. As such, the golden reference removes the need for an abstract map, which is very time consuming and error prone, and thus enhances maintainability of the specification and greatly reduces the time-to-market of the IC design project.

In some embodiments, the golden reference model is an enhanced state table-based specification comprising a plurality of tables that serve common protocol knowledge to be shared among the various phases of the IC design flow. Specifically, the reference model captures the protocol concept of the architect and is utilized by the formal verification engine 102 to prove the correctness of the protocol. It is appreciated that the reference model may be based on the OCI protocol, as described above, and therefore verification of a smaller subset of all possible states is required. The reference model is also utilized by the micro architect/RTL engine 106 to implement the protocol and by the dynamic verification engine 108 to verify the implementation of the protocol by the micro architect/RTL engine 106. Since all of the above parties in the design process consume the same information in the tables of the reference model and collaborate to deliver the IC design, the tables of the reference model need to have enough information to satisfy the demands of all these parties and at the same time keep visual clarity by avoiding any redundancy.

Figure 3:
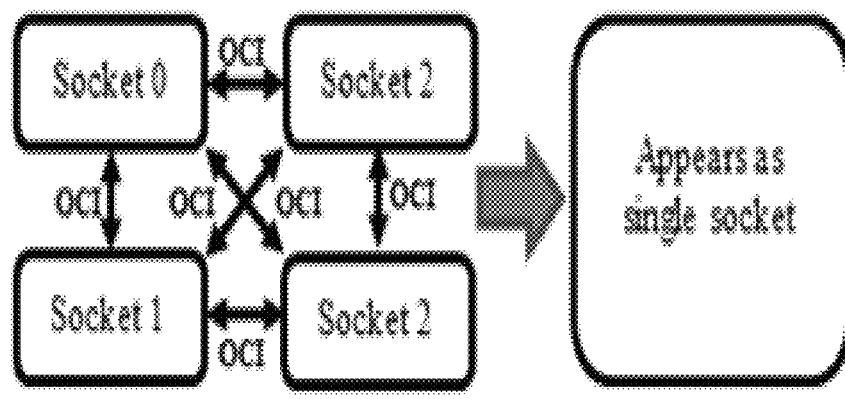
FIG. 3 depicts an example of four SOCs connected together as a single logical multicore processor via OCI connections.

In some embodiments, the IC design protocol used for the design process of an IC is a directory-based cache coherence protocol, which implements write operation coherency across various components of the IC chip including cores, memory, network, I/O, and coprocessor of the chip, meaning only one write operation is to be performed to a memory or cache of the chip at any time to maintain consistency and sanity of the data. For a non-limiting example, such directory-based cache coherence protocol can be but is not limited to an OCTEON Coherent Interconnect (OCI). FIG. 3 depicts an example of two to four OCTEON III SOCs (Socket 0, . . . , Socket 3) connected together as a single logical multicore processor via OCI connections among them. Such OCI-based architecture eliminates unnecessary memory copies in the design.

In some embodiments, each connection under the cache coherence protocol implements plurality types of virtual channels for cache coherent memory traffic among the SOCs of the chip, wherein the channels are used for submitting requests, receiving responses and forwarding data traffic. In some embodiments, the protocol is out-of-order not just across these virtual channels but also within each of the virtual channels where messages may not be received in the order they are sent.

In some embodiments, each address of a top-level SOC under the cache coherence protocol is mapped to a unique socket as shown in FIG. 3, which represents the address's home node. Since the address space is shared among a plurality of nodes, each representing a chip (e.g., SOC), any of the nodes may request data or ownership from any datum in the address space. If the datum falls in the requester's own domain, it will be a local request otherwise it will be a remote request. If a home node needs a datum, currently held by a remote node, it will issue a forwarding request to the remote node. In terms of service, the cache coherence protocol provides a plurality of services, some by the remote node and some by home node. The following are some non-limiting examples of the services provided by the cache coherence protocol:

Local address request: a core/processor in a home node requests an address. The home node provides the datum if it owns it or sends a forwarding request to a remote node that owns it.

Remote address request: a core in a remote node requests an address.

Home receive request: a home node receives a request from a remote node and sends back a response.

Remote receive response: a remote node receives the requested data/address ownership.

Remote receives forwarding request: a home node or another node needs data and a remote node forwards the data.

Home receives response: a home node gets back a response as a result of a forward or eviction.

In some embodiments, roles (home or remote) and services tables corresponding to the services listed above are automatically generated by the reference specification generation component 112 from the golden reference model. In some embodiments, the cache coherence protocol is implemented for full out-of-order transmission over the connections and their virtual channels in order to maximize transaction performance and minimize transaction latency.

Since a transaction to a remote address only needs to lookup the local cache directory, while a request to a local address (from either a home node or a remote node) needs to lookup both the local cache as well as the protocol directory of protocol, the cache coherence protocol of the golden reference model can be broken up into at least two tables in ASCII format—a home table for local address transactions as shown by the example depicted in FIG. 4A, and a remote table for remote addresses transactions as shown by the example depicted in FIG. 4B, wherein each row in the tables represents a role-based service. In some embodiments, this set of extended state tables can be used by the reference specification/model to fully describe the cache coherency protocol in terms of state transitions and protocol commands for each service provided. In other words, the extended state transition tables can be divided into unique OCI roles that are self-contained and are therefore randomly selectable and atomically executable without the need for concurrency. In other words, the self-contained services do not interact with each other's protocol space. Protocol iterations and changes thereto cause only changes to the self-contained service. As such, protocol validation is not limited or hindered by manual translations and model changes. Use of the OCI roles therefore allows non-deterministic selection of OCI roles at a given address.

In some embodiments, each of the extended state tables contains one line for every combination of a valid state and input, providing what the next state should be, and what are the protocol commands to issue to each of the nodes (also referred to as the output). For the home table depicted by the example in FIG. 4A, each state in the line includes "Cmd," which represents the request being processed, the state of the node's cache directory (H for home), and the state of each of the other nodes in the protocol directory (N1, N2, N3). The remote table depicted by the example in FIG. 4B has a similar current/next state, but only one directory state "St," which is the state of its cache directory. Here, the output includes a command (request or response) that is sent to the home node, and a column for the possible response that can be also sent to the other remote nodes.

According to some embodiments, the extended state transition tables provide a list of valid non-transient states. As such, any of the valid non-transient state can be randomly selected and executed and that the OCI service will always be valid for the selected state. Accordingly, the embodiments provide model verification tools for multiple initial states, any one of which can be selected, for which only a subset of all transitions are enabled. The verification process is therefore divided into smaller pieces and results in a faster coverage of the complete protocol transition set because only a small subset of all possible initial states are required to be verified. In other words, a subset of the instructions is used to create small models for quick assurance of the correctness of the protocol modifications.

Protocol Checking

As shown in the example of FIG. 1, protocol checking engine 104 validates the protocol generated by the formal verification engine 102 by automatically verifying the logical consistency of the formal specification of the protocol irrespective of its implementations. The requirements for protocol validation include protocol completeness and protocol correctness. Since a protocol specification includes a set of interacting finite state machines, which are essentially a set of transitions between a given state and next state for a given input, protocol checking engine 104 checks the reference specification to verify that the following problems are avoided in the specification based on the set of transitions for protocol completeness:

Under-Specification: any missing transitions in the specification will cause the design flow to enter dead-end states.

Over-Specification: any redundant transition in the specification will cause false errors in coverage collection at all levels of the design flow.

Missing/hidden assumptions: any missing or hidden assumption of machine initial states in the specification will cause false errors.

The requirements for protocol correctness typically arise from two sources—structure of the protocol and functionality of the protocol. According to these sources, protocol checking engine 104 checks the protocol specification to verify that the following problems are avoided:

Deadlock/livelock freedom: multiple interacting state machines always have the potential of having deadlocks or livelocks, which can be identified by the protocol checking engine 104 based on the structural property of the protocol.

Cache Coherence: which requires that only one node at one time have writing-rights to datum. Cache coherence can be identified by the protocol checking engine 104 based on the functional property of the protocol.

Data Consistency: which requires that the data in a given memory location is prorogated correctly. Data consistency can be identified by the protocol checking engine 104 based on the functional property of the protocol.

Most of the checks listed above are automatically generated from tables in the formal specification while others can be manually crafted. For every revision of the protocol, the protocol checking engine 104 verifies the formal verification model of the protocol for protocol completeness and correctness against all of these checks.

RTL Implementation

Even with the extended state tables in the reference specification in an ASCII parsable format, it still requires tremendous effort to understand all the internal states and transition subtleties and perform an accurate implementation according to the intent of the architect of the protocol. Because of the complexity of the protocol, numerous bugs could easily be inserted during the IC chip design process. However, it is appreciated that this task does become much simpler and much faster using the self-contained services, e.g., OCI roles, because they are randomly selectable and atomically executable without the need for concurrency. In other words, the self-contained services do not interact with each other's protocol space and protocol iterations and changes thereto cause only changes to the self-contained service. As discussed above, the extended state transition tables provide a list of valid non-transient states that can be randomly selected and executed and that the OCI service will always be valid for the selected state. Accordingly, the embodiments provide model verification tools for multiple initial states, any one of which can be selected, for which only a subset of all transitions are enabled. The verification process is therefore divided into smaller pieces and results in a faster coverage of the complete protocol transition set because only a small subset of all possible initial states are required to be verified. In other words, a subset of the instructions is used to create small models for quick assurance of the correctness of the protocol modifications. As such, understanding of the internal states and transition subtleties and performing an accurate implementation according to the intent of the architect of the protocol is significantly simplified.

In some embodiments, reference specification generation component 112 of formal verification engine 102 automatically generates a System Verilog (SV) package that includes state transitions at the RTL level for RTL implementation of the chip using the same underlying protocol representation in the reference specification, e.g., OCI model as described above, for formal verification to further reduce chances of introduction of new errors during the RTL implementation. It is appreciated that in some embodiments, after a determination that the OCI service is correct and complete, the reference specification generation component 112 of formal verification engine 102 automatically generates a System Verilog (SV) package that includes state transitions at the RTL level for RTL implementation of the chip using the same underlying protocol representation in the reference specification (not just the OCI model) for formal verification to further reduce chances of introduction of new errors during the RTL implementation. The SV package captures the behaviors, functions, and interactions among the gates and transistors within each high level components in the reference specification at the architectural level. The SV package is synthesizable in the sense that RTL level implementation of the chip design can be directly synthesized by the micro architect/RTL engine 106 from the package (vs. for a non-limiting example, a class-based specification or model that is run as a computer program first).

There are several significant benefits of implementing the protocol at the RTL level using the SV package generated by the reference specification generation component 112:

- Automatic Formal Verification: any protocol bugs found at either level of verification can be fixed in the underlying representation by the reference specification generation component 112, which immediately produces new formal verification inputs.
- Rapid Design Iteration: similarly, the same fix by the reference specification generation component 112 produces a new SV package for immediate implementation.
- Opaque State: using the SV package, protocol implementation is unaffected by the details of the state required to implement the protocol. The package need only to provide the size of the vector required to be provided between function calls.
- Parallelization of Effort: using the SV package, the protocol definition and formal verification can start before protocol implementation and continue after the implementation has started, meaning that the initial implementation of the protocol can be very confident in the stability and accuracy of the protocol from the beginning of the implementation and can thus focus solely on the details of implementing the protocol constraints specified by the architect.

In some embodiments, the SV package provides struct and enum definitions for communication between the RTL implementation and the package as well as one or more SV functions that provide the actual logic required to implement the IC design protocol. When a new protocol message arrives, the RTL implementation provides the message and current protocol state to the SV functions and receives as output the next protocol state and what messages (if any) are required to be sent to correctly maintain cache coherence under the protocol. In some embodiments, the RTL implementation may verify correctness and completeness of the self-contained service, e.g., OCI role, without the need for maintaining cache coherency because any modification to the protocol is self-contained in the self-contained services.

In some embodiments, the architect of the IC design also defines through the formal verification engine 102 certain constraints required for the implementation of the protocol beyond the logic required for implementation to ensure that all of the assumptions the architect made during protocol definition are valid. One of the most common examples is the architect's definition of virtual channels for the protocol connections. The formal verification engine 102 specifies protocol constraints that require the implementation to guarantee that lower priority channels do not block higher priority channels.

In the example of FIG. 1, the micro architect/RTL engine 106 implements the IC design protocol at the micro-architectural or RTL level using the SV package created by the reference specification generation component 112. During the RTL implementation, the micro architect engine 106 creates and utilizes its own protocols at the micro-architectural level, which on one end implements architectural definitions received from the formal verification engine 102 and on the other end interacts with other architectural protocols and implementation details, creating constraints on both. The top-level definition of the micro-architectural protocol often requires that an implementation performs multiple actions to maintain protocol consistency and cache coherence. It is appreciated that coherency may be maintained using the self-contained services because modifications to the protocol is self-contained to the self-contained service and does not impact the transition and other protocol space.

As multiple protocols interact with each other, they always have the potential of creating deadlocks, over-allocating resources, or conflicts. In addition to the benefits of using the SV package described above, utilizing the SV package at the micro-architectural level offers a few significant additions:

- Additional Formal Verification: with the low-level details incorporated into the underlying protocol definition, the formal verification inputs can be augmented with this information. This exposes previously unavailable details to the potential for formal verification. As time permits, formal verification engine 102 can expand the formal verification effort to cover as many properties of the action bits as possible.
- Explicit Constraints: the micro-architectural protocol constraints defined by the architect as described below can be directly used and checked for during RTL verification.
- Tight Integration of Low-Level Details: the simple act of reviewing the low-level implementation can lead to significant simplifications (of both the protocol and the implementation); performance improvements, and better use and allocation of resources.

In some embodiments, the constraints on the protocol that must be enforced at the micro-architectural level are defined by the architect via micro architect engine 106 to ensure no assumption of the IC design protocol is violated. For a non-limiting example, if a message arrives and the protocol requires that the memory location be removed from all caches in the local node, the micro architect engine 106 may accept and enforce a constraint that the implementation does not send its protocol messages until the removal is past the point of visibility to the rest of the system.

In some embodiments, implementation at the micro-architectural level by the micro architect engine 106 imposes its own constraints on the IC design protocol at the top level (e.g., architectural level), wherein resource sharing, datapath details, and physical implementation details are just a few non-limiting examples of such constraints that can cause deviation from the design goals. Incorporating as many of these constraints as possible into the top-level protocol is vitally important.

In some embodiments, reference specification generation component 112 of the formal verification engine 102 incorporates lower (RTL) level implementation details by the micro architect engine 106 into the tables of the reference model to reflect the implementation requirements/constraints at the RTL level as well as the understanding of the IC design protocol. Specifically, the reference specification generation component 112 extracts a set of action items/bits and incorporates them into the tables of the reference model based on detailed description of datapath for all coherency states in the protocol. After inclusion of these details, the same function call which provided protocol transition information now also provides the set of action bits which are used by the micro architect engine 106 to coordinate the datapath and control of the low-level RTL implementation. For non-limiting examples, such actions include but are not limited to, which (if any) caches to invalidate, when to send a store commit; where to read data from, which data buffers to read into, which data buffers to provide data to the protocol message when sent, and whether to allow the requester to place the data into its cache. The micro architect engine 106 enforces all of these details and action bits to operate in concert with the full IC design protocol to maintain its integrity within the parameters of the chosen design implementation.

Dynamic Verification

Figure 5:
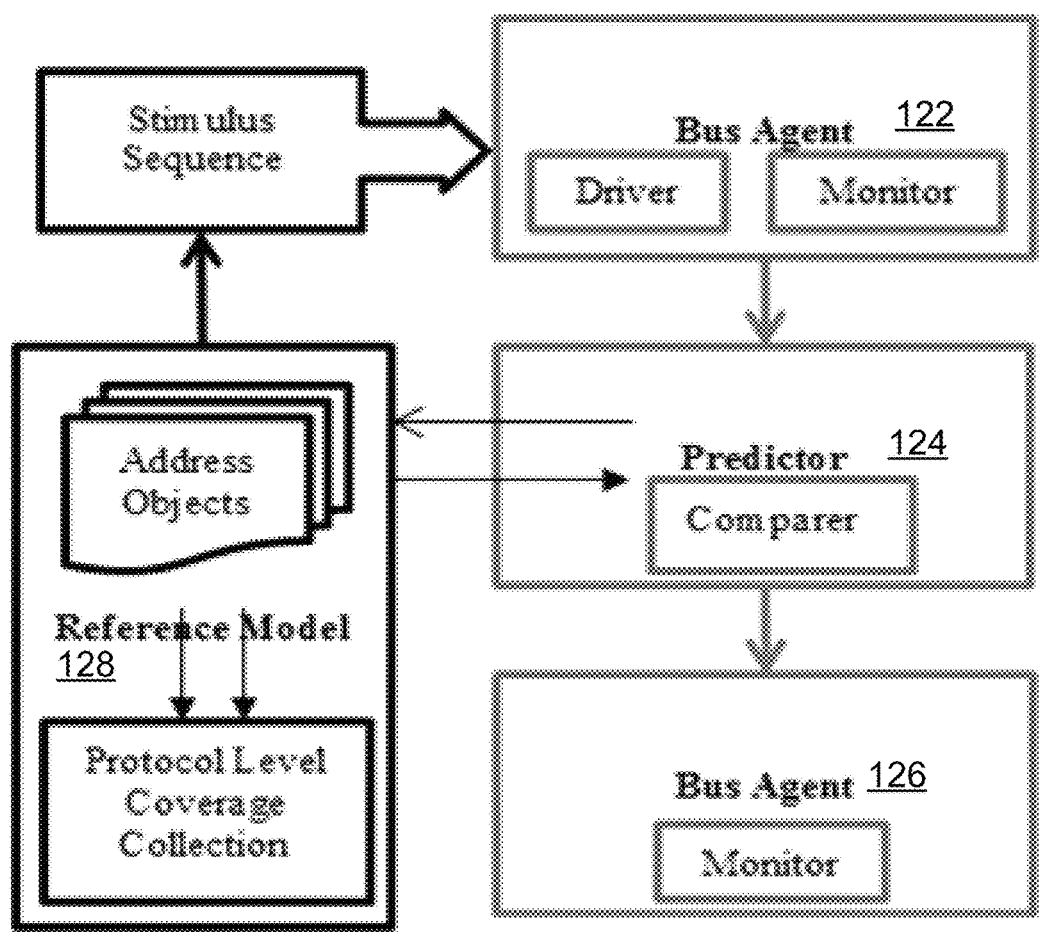
FIG. 5 depicts an example of various components within the dynamic verification engine.

In the example of FIG. 1, the dynamic verification engine 108 dynamically verifies the RTL implementation of the IC design generated by the micro architect engine 106 in real time. As shown in the example of FIG. 5, the dynamic verification engine 108 includes verification collaterals that include but are not limited to, a first bus agent 122, which takes a stimulus sequence as its input and drives and monitors the input bus. The dynamic verification engine 108 further includes a second bus agent 126, which monitor the output bus, and a predictor 124, which computes the expected responses from the input sequence and compares them against responses observed by the output bus monitor of second bus agent 126.

In some embodiments, the dynamic verification engine 106 utilizes an industry standard methodology to enable reuse of the components from past (accomplished) IC design projects and creation of reusable components for future IC design projects. Here, the industry standard methodology can be but is not limited to, Universal Verification Methodology (UVM), which is a standardized methodology for verifying integrated circuit designs.

Since the IC design protocol supports numerous requests and has a large amount of state that needs to be tracked, there are thousands of legally defined sequences, resulting in a high likelihood that verification bugs may be introduced into the predictor 124 of the dynamic verification engine 108. Additionally the predictor 124 would be very time consuming to code.

In some embodiments, dynamic verification engine 108 utilizes a separate DV reference model 128 derived from the formally verified tables in the reference model by the reference specification generation component 112 for dynamic verification of the protocol, wherein the DV reference model 128 is class-based, which includes programmable classes that provide many orders of magnitude speedup in simulations as compared to synthesizable models such as the SV package and can take advantage of all simulation runs. In some embodiments, the DV reference model is created using System Verilog classes to reduce human error and time to completion. In some embodiments, an address object of the DV reference model is instantiated for each active address, wherein the address object maintains the status of the address. Once all references to the address disappear, the corresponding address object is cleaned up.

In some embodiments, the predictor 124 of the dynamic verification engine 108 makes a function call to the DV reference model instead of using a hand-coded expected responses from a human verifier. A message for the function call is passed to the DV reference model, which returns an object containing one or more of the current state, next state, dirty masks, and the expected response. The DV reference model also indicates an error if it were an illegal time to receive the new message. This knowledge of what messages are legal at the current time is also used by the dynamic verification engine 108 to constrain the stimulus sequence so that only legal messages are produced.

Since the DV reference model is machine-generated automatically by the dynamic verification engine 108 from the tables of the reference specification formally verified by the formal verification engine 102, there is less opportunity for human error. Additionally, changes to the protocol can be reflected in the predictor 124 as soon as they are added to the reference specification and be run through the formal verification engine 102 again.

In some embodiments, dynamic verification engine 108 utilizes the DV reference model created for prediction purposes to machine-generate coverage points, which are simulation sampling points in the thousands of legally defined and/or illegal sequences in the IC design protocol. These machine-generated coverage points share the same benefits as the generated DV reference model in that they reduce human error, drastically decrease the time required to code, and can rapidly incorporate and propagate any changes to the protocol in all phases of the IC design process. Such automatic generation of coverage points eliminates the need for manual generation of coverage points as well as manual exclusion of the illegal sequences. Moreover, the machine-generated coverage points contribute to generate more interesting functional coverage points, which include but are not limited to, event cross-coverage across home and remote nodes, transition coverage of all the legal transitions, and transaction coverage of all legal transactions as a sequence of legal transitions.

Figure 6A:
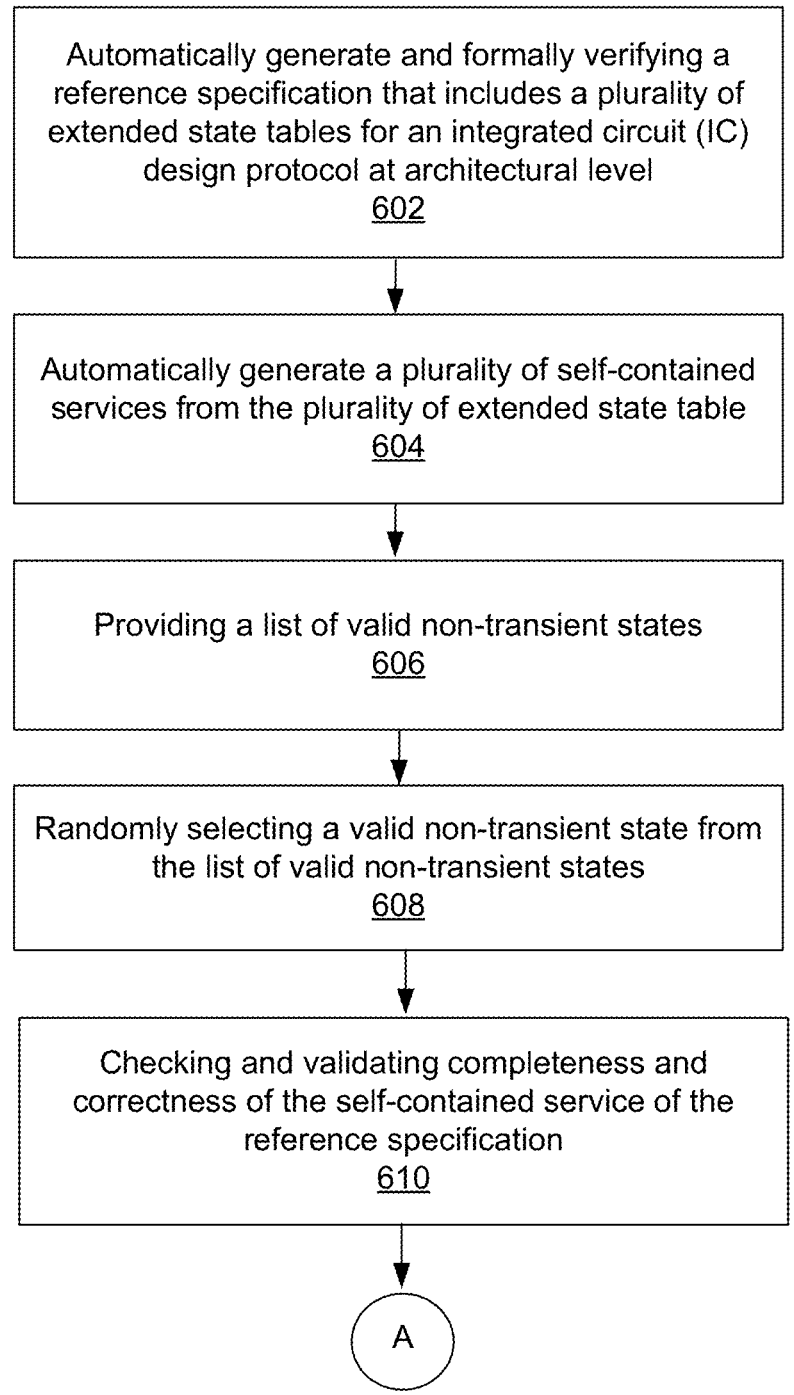
FIGS. 6A-B depict an illustrative flow diagram for design, verification and implementation protocols for design of an IC chip in accordance with some embodiments.
Figure 6B:
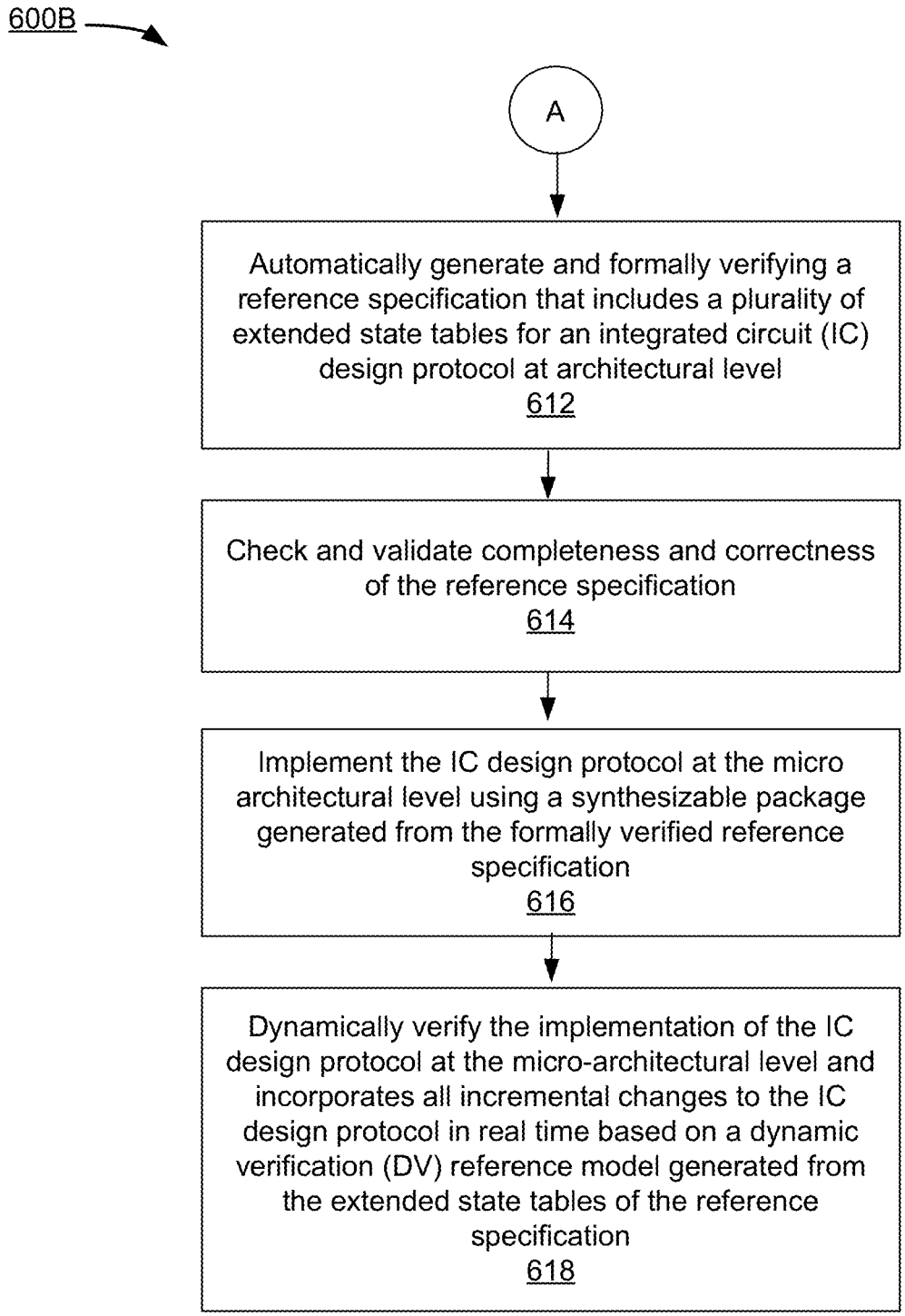

FIG. 6A-B depict an illustrative flow diagram for design, verification and implementation protocols for design of an IC chip in accordance with some embodiments. Although this figure depicts functional steps in a particular order for purposes of illustration, the process is not limited to any particular order or arrangement of steps. One skilled in the relevant art will appreciate that the various steps portrayed in this figure could be omitted, rearranged, combined and/or adapted in various ways.

At step 602, a reference specification is automatically generated and formally verified. The reference specification may include a plurality of extended state tables for an IC design protocol of a chip at architectural level. At step 604, a plurality of self-contained services is automatically generated from the plurality of extended state tables. It is appreciated that a self-contained service of the plurality of self-contained services may be randomly and atomically executable. It is further appreciated that the self-contained service of the plurality of self-contained services changes responsive to the IC design protocol changing. The plurality of self-contained services may be a model associated with the coherence protocol. The model may be parameterized based on addressees, nodes, and channel depths. The IC design protocol may include a directory-based multichip coherence interconnect (OCI) protocol for communication requests among a plurality of System-on-Chips (SOCs) of the chip.

At step 606, a list of valid non-transient states may be provided. It is appreciated that a coherent interconnect may be within a valid non-transient state of the list provided. At step 608, a valid non-transient state may be selected from the list of valid non-transient states as a starting state for the check and validation of completeness and correctness of the self-contained service of the reference specification. It is appreciated that the selection of the valid non-transient state may be random. At step 610, completeness and correctness of the self-contained service of the reference specification may be checked and validated. It is appreciated that the process may automatically transition to step 612 of flow 600B. In some embodiments, however, in response to a determination that the self-contained service is complete and correct, the process transitions to step 612 of flow 600B.

In the example of FIG. 6B, the flowchart 600B starts at block 612, where a reference specification including a plurality of extended state tables for an integrated circuit (IC) design protocol is automatically generated and formally verified at architectural level. The flowchart 600B continues to block 614, where completeness and correctness of the reference specification are checked and validated. The flowchart 600B continues to block 616, where the IC design protocol is implemented at the micro-architectural level using a synthesizable package generated from the formally verified reference specification. The flowchart 600B ends at block 618 where the implementation of the IC design protocol is dynamically verified at the micro-architectural level and incorporates all incremental changes to the IC design protocol in real time based on a DV reference model generated from the synthesizable package.

One embodiment may be implemented using a conventional general purpose or a specialized digital computer or microprocessor(s) programmed according to the teachings of the present disclosure, as will be apparent to those skilled in the computer art. Appropriate software coding can readily be prepared by skilled programmers based on the teachings of the present disclosure, as will be apparent to those skilled in the software art. The invention may also be implemented by the preparation of integrated circuits or by interconnecting an appropriate network of conventional component circuits, as will be readily apparent to those skilled in the art.

One embodiment includes a computer program product which is a machine readable medium (media) having instructions stored thereon/in which can be used to program one or more hosts to perform any of the features presented herein. The machine readable medium can include, but is not limited to, one or more types of disks including floppy disks, optical discs, DVD, CD-ROMs, micro drive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data. Stored on any one of the computer readable medium (media), the present invention includes software for controlling both the hardware of the general purpose/specialized computer or microprocessor, and for enabling the computer or microprocessor to interact with a human viewer or other mechanism utilizing the results of the present invention. Such software may include, but is not limited to, device drivers, operating systems, execution environments/containers, and applications.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Particularly, while the concept "component" is used in the embodiments of the systems and methods described above, it will be evident that such concept can be interchangeably used with equivalent concepts such as, class, method, type, interface, module, object model, and other suitable concepts. Embodiments were chosen and described in order to best describe the principles of the invention and its practical application, thereby enabling others skilled in the relevant art to understand the claimed subject matter, the various embodiments and with various modifications that are suited to the particular use contemplated.

What is claimed is:

1. A system comprising:
   a formal verification engine running on a host, which in operation, automatically generates and formally verifies a reference specification that includes a plurality of extended state tables for an integrated circuit (IC) design protocol of a chip at architectural level, wherein the formal verification engine is further configured to automatically generate a plurality of self-contained services from the plurality of extended state tables, wherein a self-contained service of the plurality of self-contained services is randomly and atomically executable, and wherein the self-contained service of the plurality of self-contained services changes responsive to the IC design protocol changing;
   a protocol checking engine running on a host, which in operation, checks and validates completeness and correctness of the self-contained service of the reference specification; and
   a micro architect engine running on a host, which in operation, implements the IC design protocol at a micro-architectural level using a synthesizable package.

2. The system of claim 1, wherein the reference specification further includes a list of valid non-transient states.

3. The system of claim 2, wherein a coherent interconnect is within a valid non-transient state of the list of valid non-transient states.

4. The system of claim 2, wherein the protocol checking engine is configured to select a valid non-transient state from the list of valid non-transient states as a starting state for the check and validation of completeness and correctness of the self-contained service of the reference specification.

5. The system of claim 1, wherein the IC design protocol is a directory-based multichip coherence interconnect (OCI) protocol.

6. The system of claim 5, wherein the plurality of self-contained services is a model associated with the coherence protocol, and wherein the model is parameterized based on addressees, nodes, and channel depths.

7. The system of claim 1, wherein the synthesizable package is generated from the formally verified reference specification, and wherein the system further comprises:
a dynamic verification (DV) engine running on a host, which in operation, dynamically verifies the implementation of the IC design protocol at the micro-architectural level and incorporates all incremental changes to the IC design protocol in real time based on a DV reference model generated from the extended state tables of the reference specification,
and wherein the micro architect engine and the DV engine are configured to operate responsive to a determination that the self-contained service of the reference specification is complete and correct.

8. The system of claim 7, wherein:
the synthesizable package captures behaviors, functions, and interactions among gates and transistors within each components in the reference specification at the architectural level.

9. The system of claim 7, wherein:
the synthesizable package includes state transitions at the micro-architectural level for resistor-transistor level (RTL) implementation of the chip using the same underlying protocol representation in the reference specification used for formal verification to reduce chances of introduction of new errors during the RTL implementation.

10. The system of claim 1, wherein:
the micro architect engine enforces a plurality of implementation constraints at the micro architect level to ensure no assumption of the protocol is violated.

11. The system of claim 10, wherein:
the formal verification engine incorporates micro architect level implementation details into the plurality of extended state tables of the reference specification to reflect the implementation constraints at the micro architect level.

12. The system of claim 7, wherein:
the IC design protocol includes the reference specification used for formal verification of the protocol at the architectural level and the synthesizable package used for implementation of the protocol at the micro-architectural level.

13. The system of claim 1, wherein:
each extended state table of the plurality of extended state tables of the reference specification is in parsable ASCII format without having any hidden states, assumptions, redundancy, or dead-ends.

14. The system of claim 1, wherein:
the IC design protocol is a directory-based cache coherence protocol, which connects a plurality of System-on-Chips (SOCs) as a single multicore processor via connections among the SOCs.

15. The system of claim 14, wherein:
each connection under the cache coherence protocol implements a plurality types of virtual channels for cache coherent memory traffic among the SOCs of the chip.

16. The system of claim 1, wherein:
the formal verification engine automatically incorporates and validates incremental changes to the protocol to support maintainability of the protocol.

17. The system of claim 16, wherein:
the formal verification engine manages the protocol in a programmable way and provides a uniform consistent output of the reference specification for the incremental changes to the protocol.

18. The system of claim 1, wherein:
the protocol checking engine checks the reference specification for one or more of under-specification, over-specification, and missing or hidden assumptions in the specification.

19. The system of claim 1, wherein:
the protocol checking engine checks the reference specification for one or more of deadlocks, cache coherence, and data consistency.

20. A computer-implemented method, the method comprising:
automatically generating and formally verifying a reference specification that includes a plurality of extended state tables for an integrated circuit (IC) design protocol of a chip at architectural level via a processor;
automatically generating a plurality of self-contained services from the plurality of extended state tables, wherein a self-contained service of the plurality of self-contained services is randomly and atomically executable, and wherein the self-contained service of the plurality of self-contained services changes responsive to the IC design protocol changing;
checking and validating completeness and correctness of the self-contained service of the reference specification; and
implementing the IC design protocol at a micro-architectural level using a synthesizable package.

21. The computer-implemented method of claim 20, wherein the method further comprises:
providing a list of valid non-transient states.

22. The computer-implemented method of claim 21, wherein a coherent interconnect is within a valid non-transient state of the list of valid non-transient states.

23. The computer-implemented method of claim 21, wherein the method further comprises:
randomly selecting a valid non-transient state from the list of valid non-transient states as a starting state for the check and validation of completeness and correctness of the self-contained service of the reference specification.

24. The computer-implemented method of claim 20, wherein the IC design protocol is a directory-based multi-chip coherence interconnect (OCI) protocol for communication requests among a plurality of System-on-Chips (SOCs) of the chip.

25. The computer-implemented method of claim 24, wherein the plurality of self-contained services is a model associated with the coherence protocol, and wherein the model is parameterized based on addressees, nodes, and channel depths.

26. The computer-implemented method of claim 20, wherein in response to a determination that the self-contained service of the reference specification is complete and correct, wherein the synthesizable package is generated from formally verified reference specification, and wherein the method further comprises:
dynamically verifying the implementation of the IC design protocol at the micro-architectural level and incorporates all incremental changes to the IC design protocol in real time based on a dynamic verification (DV) reference model generated from the extended state tables of the reference specification.

27. The computer-implemented method of claim 20, wherein the method further comprises:
checking the reference specification for one or more of under-specification, over-specification, and missing or hidden assumptions in the specification.

28. The computer-implemented method of claim 20, wherein the method further comprises:

checking the reference specification for one or more of deadlocks, cache coherence, and data consistency.

29. The computer-implemented method of claim 20, wherein the method further comprises:

parameterizing a model of coherence protocol associated with the plurality of self-contained service based on addressees, nodes, and channel depths.

30. The computer-implemented method of claim 20, wherein the method further comprises:

enforcing a plurality of implementation constraints at the micro architect level to ensure no assumption of the protocol is violated.

31. The computer-implemented method of claim 30, wherein the method further comprises:

incorporating micro architect level implementation details into the tables of the reference specification to reflect the implementation constraints at the micro architect level.

32. A computer-implemented method, the method comprising:

automatically generating a reference specification that includes a plurality of extended state tables for a coherent interconnect of an integrated circuit (IC) design protocol at architectural level via a processor;

automatically generating a plurality of self-contained services from the plurality of extended state tables, wherein a self-contained service of the plurality of self-contained services is randomly and atomically executable, and wherein the self-contained service of the plurality of self-contained services changes responsive to the coherent interconnect of the IC design protocol changing;

selecting a valid non-transient state from a list of valid non-transient states;

checking and validating completeness and correctness of the self-contained service of the reference specification starting at the selected valid non-transient state; and implementing the IC design protocol at a micro-architectural level using a synthesizable package.

33. The computer-implemented method of claim 32, wherein responsive to a determination that the self-contained service of the reference specification is complete and correct, wherein the synthesizable package is generated from formally verified reference specification, and wherein the method further comprises:

checking and validating completeness and correctness of the reference specification;

dynamically verifying the implementation of the IC design protocol at the micro-architectural level and incorporates all incremental changes to the IC design protocol in real time based on a dynamic verification (DV) reference model generated from the extended state tables of the reference specification.

* * * * *

UNITED STATES PATENT AND TRADEMARK OFFICE
CERTIFICATE OF CORRECTION

PATENT NO. : 10,002,218 B2
APPLICATION NO. : 15/065799
DATED : June 19, 2018
INVENTOR(S) : Shahid Ikram et al.

It is certified that error appears in the above-identified patent and that said Letters Patent is hereby corrected as shown below:

On the Title Page

At (54), insert --DESIGN AND-- before --VERIFICATION OF A MULTICHIP COHERENCE PROTOCOL--.

Signed and Sealed this
Twenty-eighth Day of May, 2019

Andrei Iancu
*Director of the United States Patent and Trademark Office*